United States Patent
Shibahara

(10) Patent No.: US 7,804,384 B2
(45) Date of Patent: Sep. 28, 2010

(54) ACOUSTIC WAVE FILTER DEVICE UTILIZING FILTERS HAVING DIFFERENT ACOUSTIC WAVE PROPAGATION DIRECTIONS

(75) Inventor: Teruhisa Shibahara, Kyoto (JP)

(73) Assignee: Murata Manufacturing Co., Ltd, Kyoto (JP)

( * ) Notice: Subject to any disclaimer, the term of this patent is extended or adjusted under 35 U.S.C. 154(b) by 344 days.

(21) Appl. No.: 11/995,208

(22) PCT Filed: May 23, 2006

(86) PCT No.: PCT/JP2006/310268

§ 371 (c)(1), (2), (4) Date: Jan. 10, 2008

(87) PCT Pub. No.: WO2007/007475

PCT Pub. Date: Jan. 18, 2007

(65) Prior Publication Data

US 2009/0224852 A1 Sep. 10, 2009

(30) Foreign Application Priority Data

Jul. 13, 2005 (JP) ............................. 2005-204758

(51) Int. Cl.
*H03H 9/64* (2006.01)
(52) U.S. Cl. .................................... 333/193; 333/195
(58) Field of Classification Search ......... 333/193–196; 310/313 A, 313 B, 313 C, 313 D
See application file for complete search history.

(56) References Cited

U.S. PATENT DOCUMENTS

| | | | |
|---|---|---|---|
| 3,889,205 A * | 6/1975 | Mitchell ..................... 331/41 |
| 4,193,045 A * | 3/1980 | Houkawa et al. ......... 331/107 A |
| 6,278,340 B1 * | 8/2001 | Liu ............................ 333/26 |
| 6,426,583 B1 * | 7/2002 | Onishi et al. ............ 310/313 R |
| 6,693,501 B2 | 2/2004 | Sawada et al. |
| 6,710,676 B2 * | 3/2004 | Yata et al. ................... 333/133 |

(Continued)

FOREIGN PATENT DOCUMENTS

JP 58-130613 A 8/1983

(Continued)

OTHER PUBLICATIONS

Official communication issued in counterpart Korean Application No. 10-2008-7001017, mailed on Jan. 15, 2009.

(Continued)

*Primary Examiner*—Barbara Summons
(74) *Attorney, Agent, or Firm*—Keating & Bennett, LLP

(57) ABSTRACT

An acoustic wave filter device having a balanced-to-unbalanced conversion function, in which the signal balance between a pair of balanced terminals is improved, has, on a piezoelectric substrate, one end of at least one longitudinally coupled resonator type acoustic wave filter and one end of at least one second longitudinally coupled resonator type acoustic wave filter among the rest of acoustic wave filters are commonly connected and connected to an unbalanced terminal, and the other ends of the longitudinally coupled resonator type acoustic wave filters are electrically connected to first and second balanced terminals, respectively, and in which a propagation direction of an acoustic wave in the longitudinally coupled resonator type acoustic wave filter and a propagation direction of an acoustic wave in the second longitudinally coupled resonator type acoustic filter are different from each other.

8 Claims, 7 Drawing Sheets

U.S. PATENT DOCUMENTS

| | | |
|---|---|---|
| 6,815,868 B2 | 11/2004 | Shibata et al. |
| 7,042,133 B2 | 5/2006 | Kanna |
| 7,224,101 B2 * | 5/2007 | Mishima et al. ......... 310/313 A |
| 2002/0140316 A1 | 10/2002 | Yamanouchi |
| 2004/0061575 A1 * | 4/2004 | Kando et al. ................ 333/195 |
| 2004/0106383 A1 * | 6/2004 | Yata ............................ 455/91 |
| 2004/0233018 A1 | 11/2004 | Watanabe et al. |
| 2006/0071579 A1 | 4/2006 | Kando |
| 2007/0090898 A1 * | 4/2007 | Kando ........................ 333/195 |
| 2007/0126531 A1 * | 6/2007 | Yata ............................ 333/195 |

FOREIGN PATENT DOCUMENTS

| | | | |
|---|---|---|---|
| JP | 59-151517 A | 8/1984 | |
| JP | 5-335881 | * 12/1993 | ................ 333/193 |
| JP | 06-268475 A | 9/1994 | |
| JP | 7-283688 A | 10/1995 | |
| JP | 11-136081 A | 5/1999 | |
| WO | WO 2005/060094 | * 6/2005 | |

OTHER PUBLICATIONS

Official communication issued in counterpart International Application No. PCT/JP2006/310268, mailed on Aug. 29, 2006.

Official communication issued in the International Application No. PCT/JP2006/310268; mailed on Aug. 29, 2006.

* cited by examiner

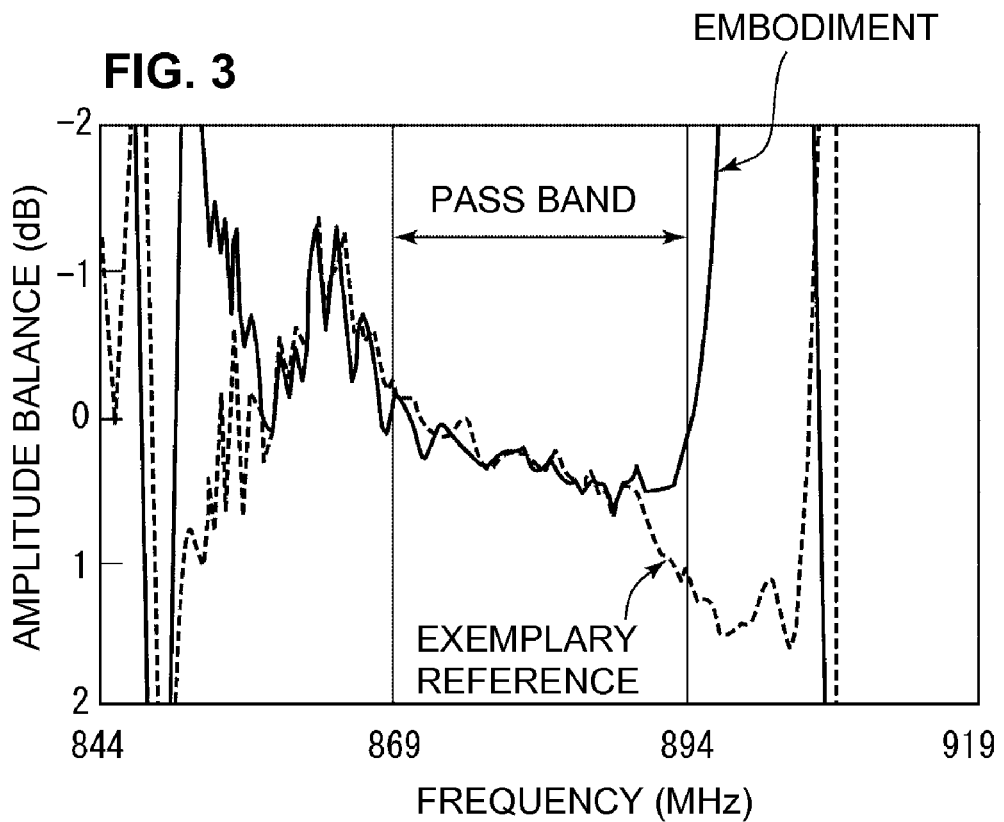

ACOUSTIC WAVE FILTER DEVICE UTILIZING FILTERS HAVING DIFFERENT ACOUSTIC WAVE PROPAGATION DIRECTIONS

BACKGROUND OF THE INVENTION

1. Field of the Invention

The present invention relates to acoustic wave filter devices utilizing surface acoustic waves or boundary acoustic waves. In particular, the present invention relates to acoustic wave filter devices having first and second longitudinally coupled resonator type acoustic wave filters disposed on piezoelectric substrates and also having a balanced-to-unbalanced conversion function.

2. Description of the Related Art

Conventionally, surface acoustic wave filters have been in widespread use as band pass filters for mobile communication apparatuses such as mobile phones and the like. Recently, boundary acoustic wave filters utilizing boundary acoustic waves instead of surface acoustic waves have drawn attention.

Band pass filters used in the RF stages of mobile phones are required to have balanced-to-unbalanced conversion functions. By using boundary acoustic wave filters having balanced-to-unbalanced functions as band pass filters, baluns can be omitted, which promotes miniaturization.

Japanese Unexamined Patent Application Publication No. 2002-374147 discloses a surface acoustic wave filter having a balanced-to-unbalanced conversion function.

FIG. 8 is a plan view illustrating an electrode structure of a surface acoustic wave filter described in Japanese Unexamined Patent Application Publication No. 2002-374147. A surface acoustic wave filter 501 has a configuration in which the shown electrode structure is formed on a piezoelectric substrate. In FIG. 8, first to third IDTs 502 to 504 are arranged along a surface acoustic wave propagation direction. Reflectors 505 and 506 are arranged along a surface acoustic wave propagation direction, on opposite sides of the area in which the IDTs 502 to 504 are provided.

A first end of the IDT 503 provided at the center is connected to an unbalanced terminal 507 and first ends of the IDTs 502 and 504 provided at opposite sides of the IDT 503 are electrically connected to first and second balanced terminals 508 and 509, respectively.

In the surface acoustic wave filter 501, the IDTs 502 and 504 are configured such that a signal supplied from the unbalanced terminal 507 to the balanced terminal 508 and a signal supplied from the unbalanced terminal 507 to the balanced terminal 509 have opposite phases. The IDT 502 is cross-width weighted so that the balance is improved.

Conventionally, in a surface acoustic filter having a balanced-to-unbalanced conversion function, there is a strong requirement to improve the balance between balanced signals input/output from first and second balanced terminals. In the surface acoustic wave filter 501 described in Japanese Unexamined Patent Application Publication No. 2002-374147, as described above, cross-width weighting is applied to the IDT 502 connected to the balanced terminal 508 with a view to improving the balance. Specifically, weighting is applied to at least one IDT 502, so that reception states of surface acoustic wave excitation in signals output from the IDTs 502 and IDT 504 are matched.

However, it is difficult to match the amount of surface acoustic wave excitation received at the IDT 502 side and the amount of surface acoustic wave excitation received at the IDT 504 side, making it difficult to sufficiently and precisely enhance the balance.

In addition, it is also difficult to design weighting that allows the amounts of surface acoustic wave excitation received at the IDTs 502 and 504 to be matched.

SUMMARY OF THE INVENTION

In order to overcome the problems described above, preferred embodiments of the present invention provide a boundary acoustic wave filter that can improve the signal balance between a pair of balanced terminals.

According to a preferred embodiment of the present invention, an acoustic wave filter device includes a piezoelectric substrate, a first longitudinally coupled resonator type acoustic wave filter which is disposed on the piezoelectric substrate and has a plurality of IDT electrodes and first and second terminals, and a second longitudinally coupled resonator type acoustic wave filter which is disposed on the piezoelectric substrate and has a plurality of IDT electrodes and third and fourth terminals, and having a balanced-to-unbalanced conversion function in which when identical signals are input to the first terminal and the third terminal, a phase difference between a signal output from the second terminal and a signal output from the fourth terminal is generally 180 degrees in at least a pass band, in which the first and third terminals are commonly connected and connected to an unbalanced terminal, and in which the second and fourth terminals are set as first and second balanced terminals, respectively. In the acoustic wave filter device, a propagation direction of an acoustic wave in the first longitudinally coupled resonator type acoustic wave filter and a propagation direction of an acoustic wave in the second longitudinally coupled resonator type acoustic wave filter are different from each other.

In a specific aspect of an acoustic wave filter device according to a preferred embodiment of the present invention, the propagation direction of an acoustic wave in the first longitudinally coupled resonator type acoustic wave filter and the propagation direction of an acoustic wave in the second longitudinally coupled resonator type acoustic wave filter are preferably different from each other, such that the difference between an insertion loss of a filter waveform output from the first balanced terminal in a pass band and an insertion loss of a filter waveform output from the second balanced terminal in a pass band is equal to or less than about ±1 dB.

In yet another specific aspect of an acoustic wave filter device according to a preferred embodiment of the present invention, an electromechanical coupling coefficient of one longitudinally coupled resonator type acoustic wave filter, among the first and second longitudinally coupled resonator type acoustic wave filters, in which excitation of an acoustic wave received in a space between a plurality of IDTs is stronger, is set to be smaller than an electromechanical coupling coefficient of the other longitudinally coupled resonator type acoustic wave filter.

In yet another specific aspect of an acoustic wave filter device according to a preferred embodiment of the present invention, at least one of the first and second longitudinally coupled resonator type acoustic wave filters is a surface acoustic filter.

In yet another specific aspect of an acoustic wave filter device according to a preferred embodiment of the present invention, at least one of the first and second longitudinally coupled resonator type acoustic wave filters is a boundary acoustic filter.

In yet another specific aspect of an acoustic wave filter device according to a preferred embodiment of the present invention, the piezoelectric substrate is preferably made of LiNbO$_3$ and is arranged so as to cover the IDTS. Euler angles $\phi$ and $\theta$ of the LiNbO$_3$ substrate preferably are in the approximate ranges of $-31$ degrees$\leq\phi\leq31$ degrees, and 90 degrees$\leq\theta\leq130$ degrees, and in the first and second longitudinally coupled resonator type acoustic wave filters, an Euler angle $\psi$ is in the approximate range of 0 degrees$\leq\psi\leq60$ degrees.

In an acoustic wave filter devices according to various preferred embodiments of the present invention, each of the IDTs preferably is composed of a metal selected from the group consisting of Al, Ti, Pt, Fe, Ni, Cr, Cu, Ag, W, Ta, and Au, or an alloy composed primarily of the metal.

In another aspect of an acoustic wave filter device according to another preferred embodiment of the present invention, the dielectric film is preferably composed of one type of dielectric selected from a group consisting of SiO$_2$, SiN, quartz crystal, LBO, langasite, langanite, and glass.

According to an acoustic wave filter device according to various preferred embodiments of the present invention, in an acoustic wave filter device having a balanced-to-unbalanced conversion function, in which individual ends of first and second longitudinally coupled resonator type acoustic wave filters are connected to an unbalanced terminal and individual other ends are connected to first and second balanced terminals, a propagation direction of an acoustic wave in the first longitudinally coupled resonator type acoustic wave filter and a propagation direction of an acoustic wave in the second longitudinally coupled resonator type acoustic wave filter are different from each other. Therefore, the signal balance between the first and second balanced terminals can be effectively improved. This is for the following reasons.

In order to set signals in the first longitudinally coupled resonator type acoustic wave filter and the second longitudinally coupled resonator type acoustic wave filter to have opposite phases, the polarity of a portion of IDTs is set to be opposite. Consequently, the reception intensity of excitation of an acoustic wave in a boundary portion between IDTs in the first longitudinally coupled resonator-type acoustic wave filter has to be different from the reception intensity of excitation of an acoustic wave in a boundary portion between IDTs in the corresponding second longitudinally coupled resonator type acoustic wave filter. When the first and second longitudinally coupled resonator type acoustic wave filters have exactly the same design parameters except the above configuration, the pass band width is large in the one that has greater reception intensity of excitation of an acoustic wave in a boundary portion between IDTs. Thus, it can be considered that the signal balance between the balanced terminals is degraded.

On the other hand, in preferred embodiments of the present invention, the acoustic wave propagation direction in the first longitudinally coupled resonator type acoustic wave filter and the acoustic wave propagation direction in the second longitudinally coupled resonator type acoustic wave filter are different from each other, and electromechanical coupling coefficients of both the filters are different from each other. When an electromechanical coupling coefficient decreases, the pass band width of a longitudinally coupled resonator type acoustic wave filter decreases, and when the electromechanical coupling coefficient increases, the pass band width increases.

In preferred embodiments of the present invention, the acoustic wave propagation directions in the first and second longitudinally coupled resonator type acoustic wave filters are set to be different from each other, such that the electromechanical coupling coefficient of one filter, among the first longitudinally coupled resonator type acoustic wave filter and the second longitudinally coupled resonator type acoustic wave filter, in which excitation of an acoustic wave received in the boundary portion between IDTs described above is relatively strong, is smaller than the other. That is, by setting acoustic wave propagation directions in the first and second longitudinally coupled resonator type acoustic wave filters to be different from each other, the electromechanical coupling coefficients can be individually optimized, and by setting the electromechanical coupling coefficient of the one in which received excitation of an acoustic wave is stronger to be smaller than the other, the pass band widths of the first and second longitudinally coupled resonator type acoustic wave filters can be matched. Accordingly, the transmission characteristics of the first and second acoustic wave filters are made similar to each other, and thus the balance of balanced signals can be effectively improved.

In other words, the acoustic wave propagation directions are set to be different from each other, such that the electromechanical coupling coefficient of one filter, among the first and second longitudinally coupled resonator type acoustic wave filters, in which excitation of a second acoustic wave received in a boundary portion between IDTs described above is stronger, that is, the filter having a wider pass band width than the other, is smaller than the electromechanical coupling coefficient of the other longitudinally coupled resonator type acoustic wave filter. This allows the pass band widths of both the filters to be matched, and thus the balance is improved.

Thus, according to preferred embodiments of the present invention, it is only necessary to set the acoustic wave propagation directions in the first and second longitudinally coupled resonator type acoustic wave filters to be different from each other. Thus, the balance can be readily and effectively improved without complicated design operations.

When the propagation directions of acoustic waves in the first and second longitudinally coupled resonator type acoustic wave filters are set to be different from each other, such that the difference between an insertion loss of a filter waveform output from the first balanced terminal in a pass band and an insertion loss of a filter waveform output from the second balanced terminal in a pass band is equal to or less than about ±1 dB, cancellation of the amplitudes of opposite-phase signals is performed efficiently, permitting further improvement of the balance.

Note that the difference between an insertion loss of a filter waveform output from the first balanced terminal in a pass band and an insertion loss of a filter waveform output from the second balanced terminal in a pass band being equal to or less than about ±1 dB means that the difference between insertion losses which can be measured at the same frequency in the pass bands of both the filters are all equal to or less than about ±1 dB.

In particular, when the propagation directions of acoustic waves in the first and second longitudinally coupled resonator type acoustic wave filters are selected such that the pass band width of a filter waveform output from the first balanced terminal and the pass band width of a filter waveform output from the second balanced terminal are the same, the signal balance between the first and second balanced terminals can be further improved.

In addition, when an electromechanical coupling coefficient of one of the longitudinally coupled resonator type acoustic wave filters, in which excitation of an acoustic wave received in a space between IDTs is stronger than the other, is set to be smaller than the electromechanical coupling coefficient of the other longitudinally coupled resonator type acoustic wave filter, the signal balance between the first and second balanced terminals can be enhanced.

In preferred embodiments of the present invention, at least one of the first and second longitudinally coupled resonator type acoustic wave filters may be a surface acoustic filter. In this case, a surface acoustic wave filter device having excellent balance can be provided in accordance with preferred embodiments of the present invention.

In addition, in various preferred embodiments of the present invention, one of the first and second longitudinally coupled resonator type acoustic wave filters may utilize a boundary acoustic filter. In this case, a boundary acoustic wave filter device having excellent balance can be provided in accordance with preferred embodiments of the present invention.

When a piezoelectric substrate is preferably composed of $LiNbO_3$, when a dielectric film is formed on the piezoelectric substrate including IDTs, when Euler angles $\phi$ and $\theta$ among Euler angles of the piezoelectric substrate are in the approximate ranges of $-31$ degrees $\leq \phi \leq 31$ degrees, and $90$ degrees $\leq \Theta \leq 130$ degrees, and when an Euler angle $\psi$ in the first and second acoustic wave filters is in the approximate range of $0$ degrees $\leq \psi \leq 60$ degrees, a electromechanical coupling coefficient $K^2$ can be changed in a wide range by changing the Euler angle $\psi$ corresponding to the propagation direction in the range from about 0 degrees to about 60 degrees. In addition, this range permits reduction of propagation loss of a boundary acoustic wave and reduction of insertion loss.

When an IDT is composed of a metal selected from the group consisting of Al, Ti, Pt, Fe, Ni, Cr, Cu, Ag, W, Ta, and Au, or an alloy composed primarily of the metal, it is possible to form an IDT using a typical electrode material which is generally used in surface acoustic wave devices and boundary acoustic wave devices.

When a dielectric film is composed of one type of dielectric selected from a group consisting of $SiO_2$, SiN, quartz crystal, LBO, langasite, langanite, and glass, a boundary acoustic wave device with excellent balance and excellent frequency temperature characteristics can be provided.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

FIG. 3 is a diagram illustrating a relationship between amplitude balance and frequency in a boundary acoustic wave device of the first preferred embodiment and an exemplary reference boundary acoustic wave filter device.

FIG. 4 is a diagram illustrating transmission characteristics obtained from first and second balanced terminals in the exemplary reference boundary acoustic wave filter device.

DETAILED DESCRIPTION OF PREFERRED EMBODIMENTS

In the following, the present invention will be clarified by describing detailed preferred embodiments of the present invention with reference to the drawings.

Figure 1:
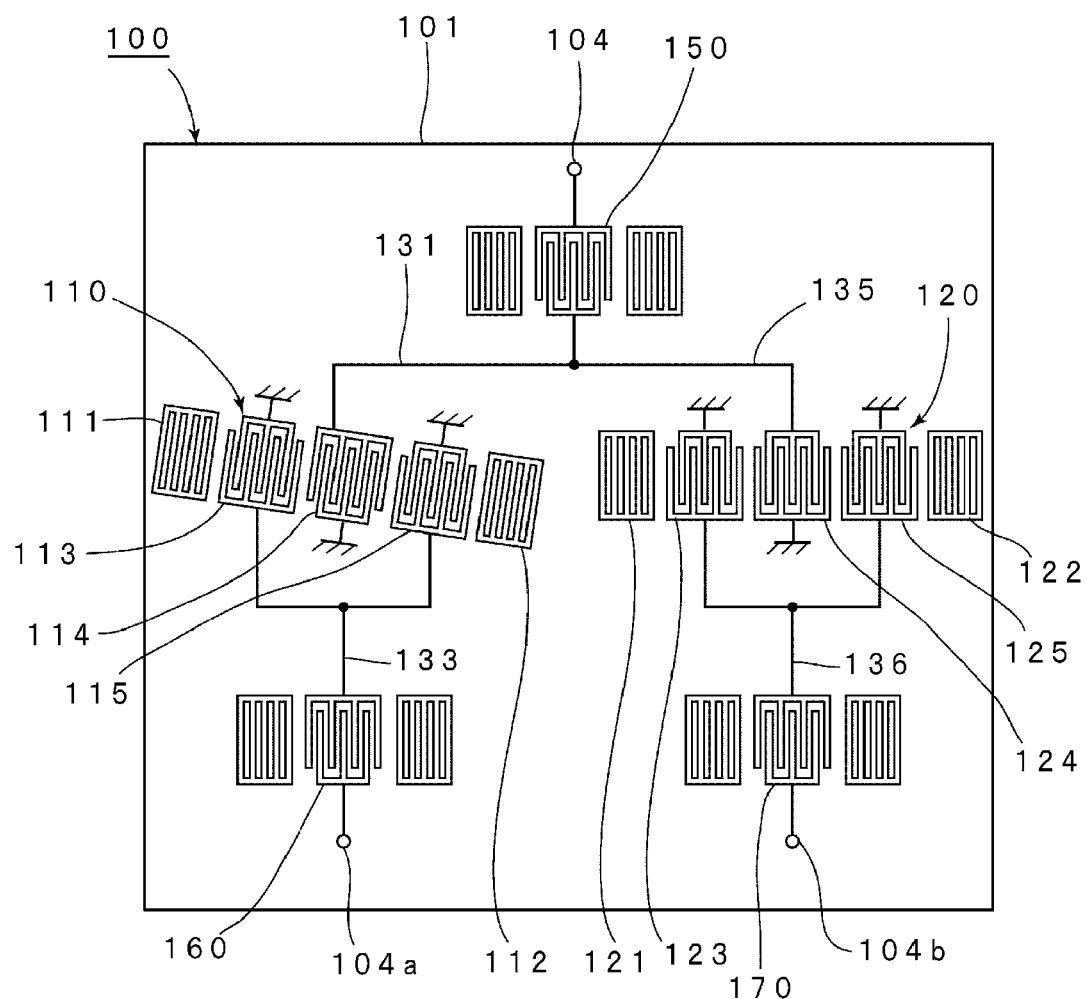
FIG. 1 is a schematic plan view illustrating an electrode structure of a boundary acoustic wave filter device according to a first preferred embodiment of the present invention.
Figure 2:
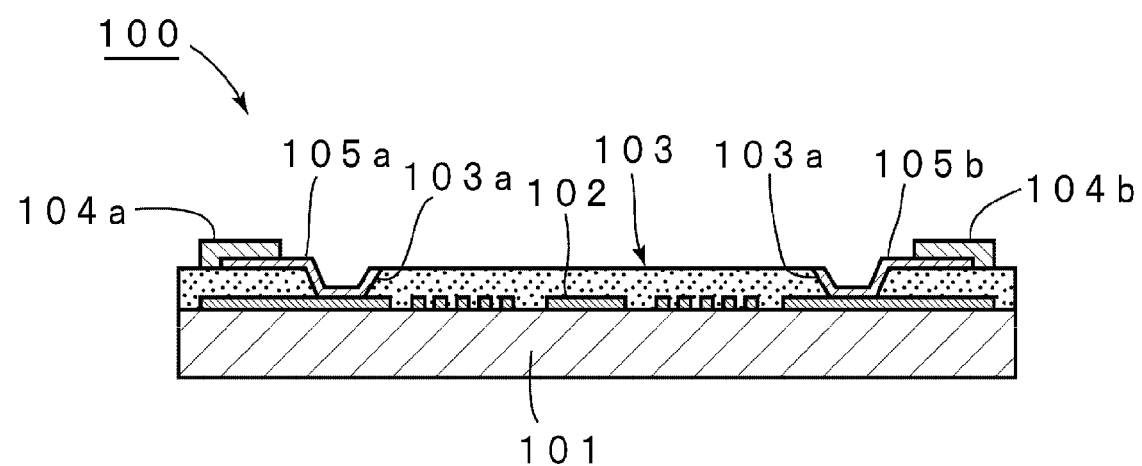
FIG. 2 is a schematic partial fragmentary elevational cross-sectional view of a boundary acoustic wave device according to the first preferred embodiment of the present invention.

FIG. 1 is a schematic plane view illustrating an electrode structure of a boundary acoustic wave device according to a preferred embodiment of the present invention. FIG. 2 is a schematic partial fragmentary elevational cross-sectional view for describing the boundary acoustic wave device.

As illustrated in FIG. 2, a boundary acoustic wave filter device 100 according to the present preferred embodiment preferably has a $LiNbO_3$ substrate 101 as a piezoelectric substrate, which is composed of $LiNbO_3$ single crystal. A $SiO_2$ film 103 is disposed on the $LiNbO_3$ substrate 101 as a dielectric film. The boundary acoustic wave filter device 100 of the present preferred embodiment utilizes an SH boundary acoustic wave propagating along the interface between the $LiNbO_3$ substrate 101 and the $SiO_2$ film 103.

In FIG. 2, an electrode pattern 102 for receiving excitation of the boundary acoustic wave described above is schematically illustrated. This electrode pattern 102 specifically corresponds to the electrode structure illustrated by the schematic plan view in FIG. 1.

Dielectric film cavity portions 103a and 103b are formed in the $SiO_2$ film 103. In each of the dielectric film cavity portions 103a and 103b, a portion of the electrode pattern 102 is exposed. Connection conductive portion 105a and 105b are formed on the dielectric film 103. The connection conductive portions 105a and 105b extend inside the dielectric film cavity portions 103a and 103b and are electrically connected to portions of the electrode pattern 102.

First and second balanced terminals 104a and 104b are formed on the upper surface of the dielectric film 103. The balanced terminals 104a and 104b are electrically connected to the connection conductive portions 105a and 105b, respectively.

The connection conductive portions 105a and 105b may be formed of an appropriate metal such as Al and Cu or an alloy. Similarly, the first and second balanced terminals 104a and 104b may be formed of an appropriate metal such as Al and Cu or an alloy.

As illustrated in FIG. 2, the electrode pattern 102 formed on the $LiNbO_3$ substrate 101 is preferably composed of a gold thin film having a thickness of about $0.05\lambda$. Note that $\lambda$ represents a wavelength corresponding to the center frequency of a boundary acoustic wave in the pass band of the boundary acoustic wave filter device 100.

Euler angles $\phi$ and $\theta$ of the $LiNbO_3$ substrate 101 are preferably about 0 degrees and about 105 degrees, respectively. In FIG. 1, the number of electrode fingers of an IDT and the number of gratings of a reflector, which will be described below, are schematically illustrated as being smaller than the actual numbers.

For the Euler angles ($\phi$, $\theta$, $\psi$), known right-handed Euler angles are preferably used. Specifically, for crystal axes X, Y, Z of LiNbO₃ single crystal, the X-axis is rotated counterclockwise around the Z-axis by φ so that the Xa-axis is obtained. Then, the Z-axis is rotated counter-clockwise around the Xa-axis by θ so that Z'-axis is obtained. A plane that includes the Xa-axis and for which the Z'-axis is normal thereto is set as the cut surface of the substrate. The direction obtained by rotating the Xa-axis counterclockwise around the Z'-axis by ψ is set as the propagation direction of a boundary acoustic wave.

For crystal axes X, Y, and Z of the LiNbO₃ single crystal which are given as the initial values of the Euler angles, the Z-axis is parallel to the c-axis, the X-axis is parallel to any one of a-axes that extend in three equivalent directions, and the Y-axis extends in a direction of the normal line of the plane including the X-axis and the Z-axis.

In FIG. 1, the direction of the normal line with respect to the plane of the drawing is obtained by rotating the crystal Z-axis of the LiNbO₃ substrate 101 counterclockwise around the crystal X-axis by about 105 degrees. In addition, in FIG. 1, the right-left direction in the drawing is the direction of the crystal X-axis of the LiNbO₃ crystal substrate 101. Thus, in FIG. 1, the Euler angle corresponding to propagation in the right-left direction in the figure preferably is ψ=0 degrees, for example. The Euler angle of a boundary acoustic wave propagating in the top-bottom direction in the figure preferably is ψ=90 degrees, for example.

The electrode pattern 102 described above has a first longitudinally coupled resonator type boundary acoustic wave filter 110, a second longitudinally coupled resonator type boundary acoustic wave filter 120, one-terminal-pair boundary acoustic wave resonators 150, 160, and 170, and lines electrically connecting therebetween.

The first longitudinally coupled resonator type boundary acoustic wave filter 110 has IDTs 113 to 115 arranged along the boundary acoustic wave propagation direction, and reflectors 111 and 112 arranged along opposite sides of an area in which the IDTs 113 to 115 are provided in the boundary acoustic wave propagation direction. Similarly, the second longitudinally coupled resonator type boundary acoustic wave filter 120 has IDTs 123 to 125 arranged along the boundary acoustic wave propagation direction and reflectors 121 and 122.

The first longitudinally coupled resonator type boundary acoustic wave filter 110 and the second longitudinally coupled resonator type boundary acoustic wave filter 120 have approximately the same design parameters. That is, the first longitudinally coupled resonator type boundary acoustic wave filter 110 and the second longitudinally coupled resonator type boundary acoustic wave filter 120 are designed to have generally the same frequency characteristics. However, the polarities of the IDT 114 and the IDT 124 are set to be opposite.

On the other hand, one ends of the IDTs 114 and 124 of the first and second longitudinally coupled resonator type boundary acoustic wave filters are connected lines 131 and 135, respectively. The lines 131 and 135 are commonly connected to an unbalanced terminal 104 via the one-terminal-pair boundary acoustic wave resonator 150. This unbalanced terminal 104 is formed on the upper surface of the SiO₂ film 103, similarly to the first and second balanced terminals 104a and 104b illustrated in FIG. 2. The unbalanced terminal 104 is electrically connected to the boundary acoustic wave resonator 150 through a connection conductive portion (not shown).

On the other hand, the IDTs 113 and 115 of the first longitudinally coupled resonator type boundary acoustic wave filter 110 are connected to the first balanced terminal 104a via the one-terminal-pair boundary acoustic wave resonator 160 through a line 133. Similarly, the IDTs 123 and 125 of the second longitudinally coupled resonator type boundary acoustic wave filter 120 are connected to the second balanced terminal 104b via the one-terminal-pair boundary acoustic wave resonator 170 through a line 136. The boundary acoustic wave propagation direction in the second longitudinally coupled resonator type boundary acoustic wave filter 120 and the one-terminal-pair boundary acoustic wave resonators 150, 160, and 170 is preferably set as ψ=0 degrees, for example. On the other hand, ψ corresponding to the boundary acoustic wave propagation direction in the first longitudinally coupled resonator type boundary acoustic wave filter 110 is preferably set to about 10 degrees, for example.

That is, the first and second longitudinally coupled resonator type boundary acoustic wave filters 110 and 120 are preferably configured to have generally the same frequency characteristics. However, the boundary acoustic wave propagation directions in the first and second longitudinally coupled resonator type boundary acoustic wave filters 110 and 120 are preferably set to be different from each other.

The boundary acoustic wave filter device 100 according to the present preferred embodiment has the unbalanced terminal 104 and the first and second balanced terminals 104a and 104b, as described above. The polarity of the IDT 114 and the polarity of the IDT 124 are set to be opposite so that the difference in phase between a signal supplied from the unbalanced terminal 104 to the first balanced terminal 104a and a signal supplied from the unbalanced terminal 104 to the second balanced terminal 104b is generally 180 degrees. Therefore, the boundary acoustic wave filter device 100 has a balanced-to-unbalanced function.

Each of the longitudinally coupled resonator type boundary acoustic wave filters 110 and 120 has filter characteristics in which signals within the pass band are passed and signals in the attenuation band are attenuated. In addition, each of the one-terminal-pair boundary acoustic wave resonators 150, 160, and 170 is configured to have a low impedance in the pass band of the boundary acoustic wave filter device 100 and to have a high impedance in a band outside the pass band. Thus, the amount of attenuation outside the pass band is increased by connecting the one-terminal-pair boundary acoustic wave resonators 150 to 170.

In addition, in the boundary acoustic wave filter device 100, since the propagation directions of boundary acoustic waves in the first and second longitudinally coupled resonator type boundary acoustic wave filters 110 and 120 are set to be different from each other, the balance can be effectively improved. This will be described in more detail with reference to FIG. 3 to FIG. 5.

FIG. 3 illustrates a comparison of the amplitude balance of balanced signals in the boundary acoustic wave device according to the above preferred embodiment and an amplitude balance of balanced signals in an exemplary reference boundary acoustic wave filter device, which was prepared for comparison. The exemplary reference boundary acoustic wave filter device prepared for comparison was fabricated similarly to the boundary acoustic wave filter device according to the present preferred embodiment, except that in the exemplary reference boundary acoustic wave filter device, the propagation direction of a boundary acoustic wave in the first longitudinally coupled resonator type boundary acoustic wave filter 110 was set to be the same as the propagation direction of a boundary acoustic wave in the second longitudinally coupled resonator type boundary acoustic wave filter 120.

In FIG. 3, the solid line indicates the result in the case of the present preferred embodiment, and the broken line indicates the result in the case of the comparative example. The balanced terminals include the first and second balanced terminals 104a and 104b. The amplitude balance of balanced signals refers to the intensity ratio between the amplitude of a signal output from one of the pair of balanced terminals and the amplitude of a signal output from the other one of the pair of balanced terminals. The ratio of the signal powers is expressed in dB. Ideally, the amplitude balance of balanced signals is 0 (dB).

As is apparent from FIG. 3, in the case of the present preferred embodiment, as compared to the case of the comparative example, the amplitude balance is effectively enhanced in the pass band, particularly at around 890 MHz to 894 MHz, which is the high side of the pass band.

Figure 5:
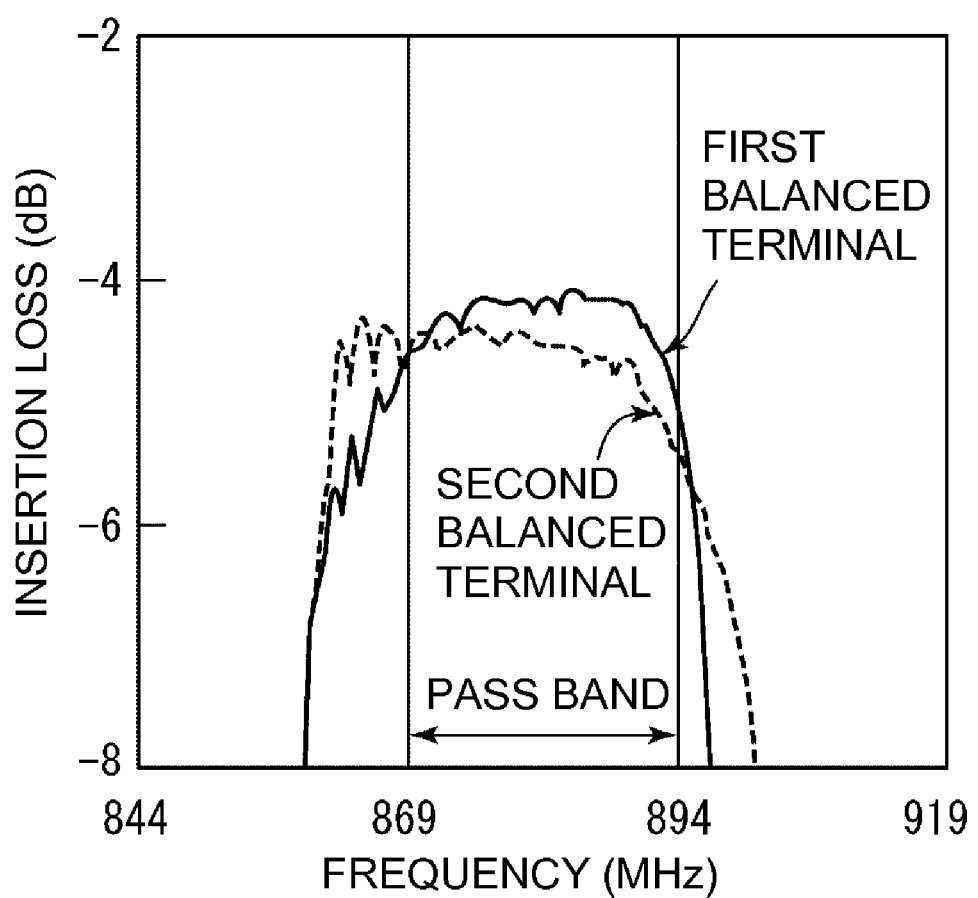
FIG. 5 is a diagram illustrating transmission characteristics obtained from first and second balanced terminals in the boundary acoustic wave filter device of the first preferred embodiment.

FIG. 4 illustrates the transmission characteristic of the balanced terminal 104a and the transmission characteristic of the balanced terminal 104b in the above comparative example boundary acoustic wave filter device. FIG. 5 illustrates the transmission characteristic of the balanced terminal 104a and the transmission characteristic of the balanced terminal 104b in the boundary acoustic wave filter device of the above preferred embodiment.

In each of FIG. 4 and FIG. 5, the solid line indicates the transmission characteristic obtained from the first balanced terminal, and the broken line indicates the transmission characteristic obtained from the second balanced terminal.

The amplitude balance of signals output to the first and second balanced terminals illustrated in FIG. 4 is indicated by the broken line in FIG. 3, and the amplitude balance of signals output to the first and second balanced terminals illustrated in FIG. 5 is indicated by the solid line in FIG. 3.

In FIG. 4 and FIG. 5, for the transmission characteristic, a ratio of transmitted signal power to input signal power is expressed as an insertion loss (dB).

As can be seen from FIG. 4, in the case of the comparative example, the insertion loss of a signal output from one of the balanced terminals and the insertion loss of a signal output from the other one of the balanced terminals are significantly different, indicating that the amplitude balance of the balanced signals is degraded.

Note that a pass band herein refers to a pass band that is required for a boundary acoustic wave filter device.

On the other hand, as is apparent from FIG. 5, according to the present preferred embodiment, in the transmission characteristics obtained from the first and second balanced terminals 104a and 104b, the difference between the attenuation losses in the pass band is small, indicating that the amplitude balance of the balanced signals is improved.

This may be for the following reasons.

That is, in the comparative example boundary acoustic wave filter device, the boundary acoustic wave propagation directions in the first and second longitudinally coupled resonator type boundary acoustic wave filters are the same and both are set as $\psi=0$ degree. In addition, the boundary acoustic wave filters 110 and 120 have approximately the same design parameters. In this case, in the transmission characteristic of the boundary acoustic wave filter 110, in which boundary acoustic wave excitation is received in a space between IDTs, the insertion losses at frequencies higher than the center frequency are better than the insertion losses at frequencies lower than the center frequency. On the other hand, in the transmission characteristic of the boundary acoustic wave filter 120, in which boundary acoustic wave excitation is not received in a space between IDTs, the insertion losses at frequencies higher than the center frequency are worse than the insertion losses at frequencies lower than the center frequency. This causes a difference in insertion loss in the pass band between the balanced signal output from the balanced terminal 104a and the balanced signal output from the balanced terminal 104b, and thus the amplitude balance is degraded.

On the other hand, in the case of the above preferred embodiment, the boundary acoustic wave propagation direction in the first longitudinally coupled resonator type boundary acoustic wave filter 110 is preferably set as $\psi=10$ degrees, for example. The boundary acoustic wave propagation direction in the second longitudinally coupled resonator type boundary acoustic wave filter 120 is preferably set as $\psi=0$ degrees, for example. Thus, the electromechanical coupling coefficient $K^2$ of a boundary acoustic wave in the first boundary acoustic wave filter 110 is set to be smaller than the electromechanical coupling coefficient of a boundary acoustic wave in the second boundary acoustic wave filter 120. The band width of the transmission characteristic of a longitudinally coupled resonator type boundary acoustic wave filter such as the boundary acoustic wave filters 110 and 120 is approximately proportional to the electromechanical coupling coefficient $K^2$. Therefore, by setting the band width of the transmission characteristic of the first boundary acoustic wave filter 110 to be relatively small according to the above configuration, the difference in insertion loss in the pass band between the first and second boundary acoustic wave filters 110 and 120 is reduced. As a result, the amplitude balance is improved.

Thus, according to the present preferred embodiment, the propagation directions of boundary acoustic waves in the first and second longitudinally coupled resonator type boundary acoustic wave filters are set to be different from each other, and the band widths of the filter transmission characteristics are set so that the difference between the insertion losses of the filters in the pass band is small. Thus, the amplitude balance is effectively improved.

As is apparent from FIG. 5, in the boundary acoustic wave device of the present preferred embodiment, the difference in insertion loss between the first balanced terminal side and the second balanced terminal side is set to approximately 0.5 dB, and the balance is also set to approximately 0.5 dB. On the other hand, as is apparent from FIG. 4 illustrating the result of the case of the exemplary reference, in the case of the exemplary reference, the difference in insertion loss exceeds about 1 dB, and the balance exceeds 1 dB around a high frequency in the pass band. Specifically, in various preferred embodiments of the present invention, it is desirable that the propagation directions of boundary acoustic waves in the first and second boundary acoustic wave filters are preferably different from each other, preferably such that the difference between the insertion loss of a filter waveform output from the first balanced terminal in the pass band and the insertion loss of a filter waveform output from the second balanced terminal in the pass band is equal to or less than about ±1 dB.

Apparently, the pass band characteristics of the first and second longitudinally coupled resonator type boundary acoustic wave filters vary depending on various factors of design parameters. As a preferred embodiment that is different from the above-described preferred embodiment, it can also be configured such that the propagation directions of boundary acoustic waves in the filters are set to be different from each other, such that the band widths of the transmission characteristics of the filters are generally equal, when the band widths of the transmission characteristics of the filters are different despite that the difference in insertion loss is originally small. In this case, it is preferable that the center frequencies of the filters are also set to be equal so that the transmission characteristics of the filters are approximately the same. With this arrangement, an improved amplitude balance can be obtained even in the outside of the pass band.

The bandwidth of a transmission characteristic herein refers to a bandwidth corresponding to an insertion loss decreased by about 3 dB from the smallest insertion loss.

The generally equal band widths of transmission characteristics do not only mean the completely equal band widths, but also means that an allowance may be approximately +0.2% in band width ratio expressed by the ratio of the band width of the transmission characteristic to the center frequency. That is, the generally equal band widths of the transmission characteristics include the equal band widths and band widths whose difference is approximately +0.2% in band width ratio.

When a LiNbO$_3$ substrate is used, when Euler angles $\phi$ and $\theta$ are in the approximate ranges of −31 degrees≦$\phi$≦+31 degrees and 90 degrees≦$\theta$≦130 degrees, the Euler angle $\psi$, which represents a propagation direction of a boundary acoustic wave propagating along the boundary to a laminated dielectric film, is changed in an approximate range of about 0 degree to about 60 degrees. This allows the electromechanical coupling coefficient $K^2$ to be changed in a range of about 16% to approximately 0%. In addition, in this range, no propagation loss of a boundary acoustic wave occurs. Therefore, by setting the values of $\phi$ and $\theta$ of the LiNbO$_3$ substrate within the above ranges, a boundary acoustic wave filter device with low loss can be provided.

Figure 6:
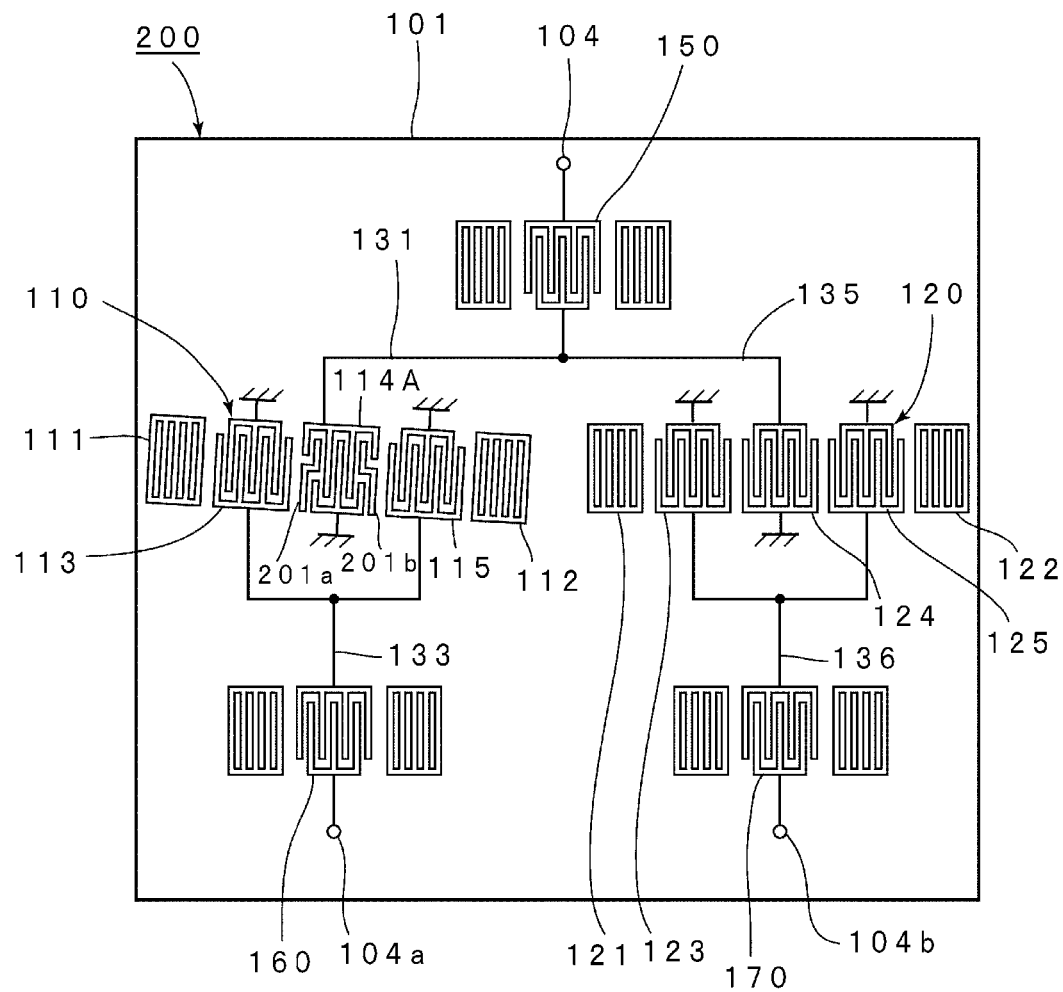
FIG. 6 is a schematic plan view illustrating an electrode structure of a boundary acoustic wave filter device according to a second preferred embodiment of the present invention.

FIG. 6 is a schematic plan view illustrating an electrode structure of a boundary acoustic wave filter device according to the second preferred embodiment of the present invention. A boundary acoustic wave filter device 200 of the second preferred embodiment is similarly configured, except that the IDT 114A provided at the center of the first longitudinally coupled resonator type boundary acoustic filter 110 is different from the IDT 114 in the first preferred embodiment. Thus, like elements are designated by like reference numerals, and the description thereof will be omitted.

In the boundary acoustic wave filter device 200 according to the present preferred embodiment, series weighting is applied to the IDT 114A at the center of the longitudinally coupled resonator type boundary acoustic wave filter 110, as illustrated in the figure. Series weighting refers to an arrangement in which floating electrode fingers 201a and 201b are provided at the ends of the outermost electrode fingers of the IDT 114A in the boundary acoustic wave propagation direction, and the floating electrode fingers 201a and 201b are arranged so as to extend to the ends of electrode fingers immediately adjacent to the outermost electrode fingers via gaps. This series weighting reduces the reception intensity of excitation of a boundary acoustic wave in a boundary between IDTs. This makes it possible to narrow the bandwidth of the first longitudinally coupled resonator type boundary acoustic wave filter 110, which has a large pass band width, when it is designed to have the same frequency characteristics. It has been known that series weighting applied to an IDT permits adjustment of the pass band width of a longitudinally coupled resonator type boundary acoustic wave filter.

Such a known technique of adjusting the pass bandwidth by series weighting in a boundary acoustic wave filter device may be applied to preferred embodiments of the present invention to more effectively improve the balance of signals.

In the second preferred embodiment, the Euler angle $\psi$ corresponding to a boundary acoustic wave propagation direction in the first longitudinally coupled resonator type boundary acoustic wave filter 110 can be set to be smaller than the Euler angle $\psi$ corresponding to a boundary acoustic wave propagation direction in the first longitudinally coupled resonator type boundary acoustic wave filter of the longitudinally coupled resonator type boundary acoustic wave filters of the first embodiment, and it is preferably set as $\psi$=5 degrees, for example. This is because the band width can be adjusted by the series weighting described above and thus only a small amount of adjustment of a pass band width for the boundary acoustic wave propagation direction is necessary.

Figure 7:
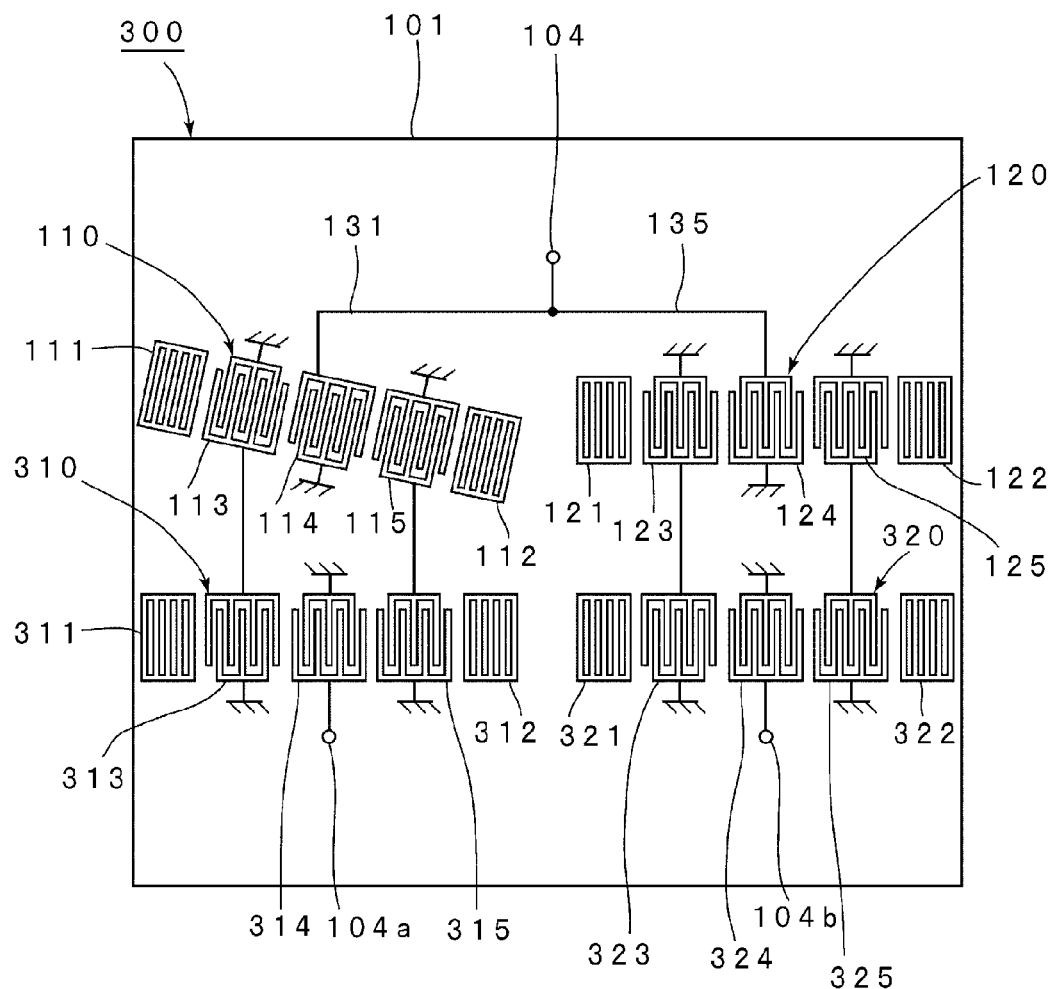
FIG. 7 is a schematic plan view illustrating an electrode structure of a boundary acoustic wave filter device according to a third preferred embodiment of the present invention.
Figure 8:
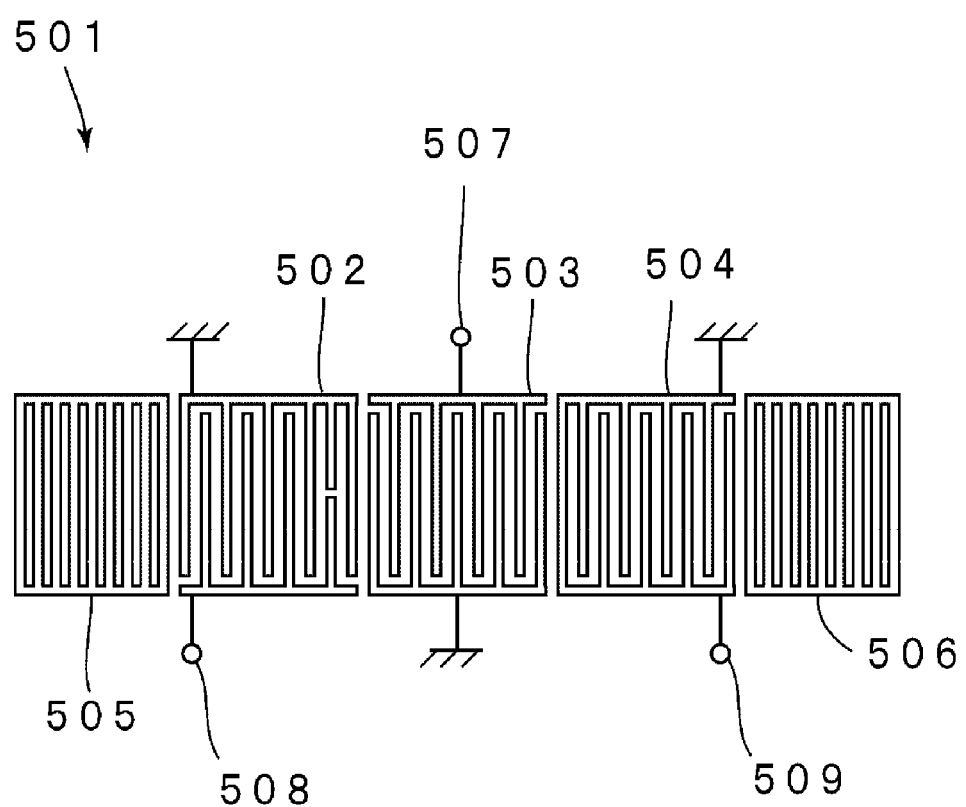
FIG. 8 is a schematic plan view illustrating an electrode structure of a conventional surface acoustic wave filter device.

FIG. 7 is a schematic plan view of a boundary acoustic wave filter device according to a third preferred embodiment of the present invention.

A boundary acoustic wave filter device 300 according to the third preferred embodiment does not have one-terminal-pair boundary acoustic wave resonators 150, 160, and 170. However, third and fourth longitudinally coupled resonator type boundary acoustic wave filters 310 and 320 are connected to the downstream sides of the first and second longitudinally coupled resonator type boundary acoustic wave filters 110 and 120, respectively so as to form a two-stage cascade configuration. Except for this two-stage cascade configuration, the third preferred embodiment is similar to the first preferred embodiment. Thus, like elements are designated by like reference numerals, and the description thereof will be omitted.

The third and fourth longitudinally coupled resonator type boundary acoustic wave filters 310 and 320 have IDTs 313 to 315 and IDTs 323 to 325, respectively, and reflectors 311 and 312, and 321 and 322, respectively. The third and the fourth longitudinally coupled resonator type boundary acoustic wave filters 310 and 320 are configured similarly to the second longitudinally coupled resonator type boundary acoustic wave filter 120.

Thus, the boundary acoustic wave filter device according to various preferred embodiments of the present invention may have a configuration in which another longitudinally coupled resonator type boundary acoustic wave filter is connected in addition to at least two boundary acoustic wave filters 110 and 120.

In the first to third preferred embodiments described above, a 3-IDT type longitudinally coupled resonator type boundary acoustic wave filter having three IDTs preferably is used. However, it is also possible to use a longitudinally coupled resonator type boundary acoustic wave filter having more IDTs such as a 5-IDT type and a 7-IDT type, for example.

In addition, while a boundary acoustic wave filter device has been described in the first to third preferred embodiments, the present invention may be applied to a surface acoustic wave device utilizing surface acoustic waves. Specifically, at least one of first and second longitudinally coupled resonator type acoustic wave filters may be a boundary acoustic wave filter, and at least one of first and second longitudinally coupled resonator type acoustic wave filter may be a surface acoustic wave filter.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. An acoustic wave filter device comprising:
   a piezoelectric substrate;
   a first longitudinally coupled resonator type acoustic wave filter which is disposed on the piezoelectric substrate and has a plurality of IDT electrodes and first and second terminals; and a second longitudinally coupled resonator type acoustic wave filter which is disposed on the piezoelectric substrate and has a plurality of IDT electrodes and third and fourth terminals; wherein the acoustic wave filter device has a balanced-to-unbalanced conversion function in which, when identical signals are input to the first terminal and the third terminal, a phase difference between a signal output from the second terminal and a signal output from the fourth terminal is approximately 180 degrees in at least a pass band;

the first and third terminals are commonly connected and connected to an unbalanced terminal; and the second and fourth terminals are set as first and second balanced terminals, respectively;

a propagation direction of an acoustic wave in the first longitudinally coupled resonator type acoustic wave filter and a propagation direction of an acoustic wave in the second longitudinally coupled resonator type acoustic wave filter are different from each other.

2. The acoustic wave filter device according to claim 1, wherein the propagation direction of an acoustic wave in the first longitudinally coupled resonator type acoustic wave filter and the propagation direction of an acoustic wave in the second longitudinally coupled resonator type acoustic wave filter are different from each other, such that the difference between an insertion loss of a filter waveform output from the first balanced terminal in a pass band and an insertion loss of a filter waveform output from the second balanced terminal in a pass band is equal to or less than about ±1 dB.

3. The acoustic wave filter device according to claim 1, wherein an electromechanical coupling coefficient of one longitudinally coupled resonator type acoustic wave filter, among the first and second longitudinally coupled resonator type acoustic wave filters, in which excitation of an acoustic wave received in a space between a plurality of IDTs is stronger, is smaller than an electromechanical coupling coefficient of the other longitudinally coupled resonator type acoustic wave filter.

4. The acoustic wave filter device according to claim 1, wherein at least one of the first and second longitudinally coupled resonator type acoustic wave filters is a surface acoustic wave filter.

5. The acoustic wave filter device according to claim 1, wherein at least one of the first and second longitudinally coupled resonator type acoustic wave filters is a boundary acoustic wave filter.

6. The acoustic wave filter device according to claim 5, wherein the piezoelectric substrate is composed of $LiNbO_3$, a dielectric film is arranged so as to cover the IDTs on the piezoelectric substrate, Euler angles $\phi$ and $\theta$ of the $LiNbO_3$ substrate are in approximate ranges of $-31$ degrees $\leq \phi \leq 31$ degrees, and 90 degrees $\leq \theta \leq 130$ degrees, and in the first and second longitudinally coupled resonator type acoustic wave filters, an Euler angle $\psi$ is in an approximate range of 0 degrees $\leq \psi \leq 60$ degrees.

7. The acoustic wave filter device according to claim 6, wherein the dielectric film is composed of one type of dielectric selected from the group consisting of $SiO_2$, SiN, quartz crystal, LBO, langasite, langanite, and glass.

8. The acoustic wave filter device according to claim 1, wherein each of the IDTs is composed of a metal selected from the group consisting of Al, Ti, Pt, Fe, Ni, Cr, Cu, Ag, W, Ta, and Au, or an alloy composed primarily of the metal.

* * * * *